United States Patent
Gagnon et al.

(10) Patent No.: US 9,395,147 B2
(45) Date of Patent: Jul. 19, 2016

(54) SYSTEMS AND METHODS FOR DETERMINING A STATUS OF AN ELECTRICAL COUPLING

(75) Inventors: Reinhard J. Gagnon, Phoenix, AZ (US); Steven N. D. Brundula, Chandler, AZ (US)

(73) Assignee: TASER International, Inc., Scottsdale, AZ (US)

( * ) Notice: Subject to any disclaimer, the term of this patent is extended or adjusted under 35 U.S.C. 154(b) by 524 days.

(21) Appl. No.: 12/891,666

(22) Filed: Sep. 27, 2010

(65) Prior Publication Data

US 2012/0078554 A1    Mar. 29, 2012

(51) Int. Cl.
*G06F 19/00* (2011.01)
*G01R 19/00* (2006.01)
*F41B 15/04* (2006.01)
*G01R 31/02* (2006.01)

(52) U.S. Cl.
CPC .............. *F41B 15/04* (2013.01); *G01R 31/026* (2013.01)

(58) Field of Classification Search
CPC ............................ G01R 31/026; F41B 15/04
USPC .......................................................... 702/64
See application file for complete search history.

(56) References Cited

U.S. PATENT DOCUMENTS

| | | | |
|---|---|---|---|
| 5,654,867 A | 8/1997 | Murray | |
| 7,057,872 B2 | 6/2006 | Smith | |
| 7,602,597 B2 | 10/2009 | Smith | |
| 2006/0256498 A1* | 11/2006 | Smith et al. | 361/232 |
| 2008/0158769 A1* | 7/2008 | Brundula | 361/232 |
| 2008/0204965 A1* | 8/2008 | Brundula et al. | 361/232 |
| 2009/0319007 A1 | 12/2009 | McNulty | |

* cited by examiner

*Primary Examiner* — Patrick Assouad
*Assistant Examiner* — Haidong Zhang
(74) *Attorney, Agent, or Firm* — Lawrence Letham (57) ABSTRACT

An apparatus for interfering with locomotion of a target by conducting a current through a load that includes an ionizable path. The apparatus includes, according to various aspects of the present invention, detectors and a processing circuit that determines a status of an electrical connection with the load.

38 Claims, 4 Drawing Sheets

| CONTACT STATUS | IONIZATION VOLTAGE (VOLTS) | STIMULUS VOLTAGE (VOLTS) | CHARGE DELIVERED (uCOULOMBS) |
|---|---|---|---|
| GOOD | 200 =< VI <= 400  302 | N/A  304 | 55 =< QD < 71  306 |
| PARTIAL | 400 < VI <= 800  308 | 2400 =< VS <= 3800  310 | 50 =< QD < 75  312 |
| NO | ANY COMBINATION OUTSIDE THE ABOVE RANGES  314 | | |

SYSTEMS AND METHODS FOR DETERMINING A STATUS OF AN ELECTRICAL COUPLING

FIELD OF THE INVENTION

Embodiments of the present invention relate to systems and methods for determining a status of an electrical coupling of a circuit to a load for providing electrical pulses of current to the load.

BACKGROUND

A circuit through a load provides a current through the load. Establishing a circuit through the load may include ionizing air in a gap between a conductor of the circuit and the load. The circuit may provide a current through the load to delivery an amount of charge through the load. An amount of charge may have an effect on the load. A circuit may adjust delivery of the current to ionize air in a gap and to provide the desired amount if charge.

A circuit that provides a current through a load may include an electronic weapon and an electrical coupling from the weapon to the load. An electronic weapon may provide a current through a load to impede locomotion of a human or animal target by interfering with use of skeletal muscles by the target. An electronic weapon may provide a first quantity of energy to ionize air in a gap between a terminal or electrode of the electronic weapon and the target to establish a circuit through the target. After ionization, the electronic weapon may provide a second quantity of energy through the circuit to impede locomotion of the target. The second quantity of energy may provide an effective (e.g., desired) amount of charge through the target. An effective amount of charge causes skeletal muscles of the target to contract thereby interfering with locomotion of the target.

BRIEF DESCRIPTION OF THE DRAWING

Embodiments of the present invention will now be further described with reference to the drawing, wherein like designations denote like elements, and.

DETAILED DESCRIPTION OF THE PREFERRED EMBODIMENTS

A circuit according to various aspects of the present invention delivers a current into a load and may be referred to as a driver or a driving circuit. Such a circuit may be electrically isolated from a load by an insulator. An insulator may include air in a gap between a conductor of the circuit and the load. A circuit may overcome the isolation provided by the insulator to establish a circuit through the load. A circuit may overcome the isolation provided by air in a gap by ionizing the air in the gap to establish an electrical circuit (e.g., coupling) with the load. After an electrical circuit is established with the load, the circuit may deliver or continue delivering the current through the load.

The driver may provide the first quantity of energy to ionize air in a gap between a conductor of the circuit and the load. The driver may provide a second quantity of energy through the load after ionization has established an electrical circuit. The second quantity of energy may be provided through the load to have an effect on the load (e.g., stimulate skeletal muscle contractions). The first quantity of energy and the second quantity of energy may deliver an amount of charge through the load.

The first quantity of energy and the second quantity of energy may be delivered as a pulse of current. A first portion of the pulse may include the first quantity of energy and the second (e.g., later, remaining) portion of the pulse, after the first portion has accomplished ionization, may include the second quantity of energy. The first portion of the pulse may provide the first quantity of energy at a relatively high voltage to accomplish ionization. The second portion of the pulse may provide the second quantity of energy through the ionization pathway at a lower voltage. Voltages may be of the same or opposite polarities.

Delivery of a first quantity of energy and a second quantity of energy may be repeated to provide a series of pulses of current. Between each pulse, little or no energy is delivered through the load. The pulses may be provided at a rate of repetition.

A circuit may adjust a characteristic (e.g., voltage, amount) of the first quantity of energy to conserve energy while accomplishing ionization. The electronic weapon may adjust a characteristic of the second quantity of energy to consistently provide an effective amount of charge. The load and/or the electrical circuit between the circuit and the load may change while the circuit delivers a current through the load. A change in the load or in the electrical circuit may affect the delivery of the current through the load. After a change in the load or the electrical circuit, a characteristic (e.g., voltage, timing, amplitude, duration, amount of energy) of the first quantity of energy and the second quantity of energy may be adjusted to continue delivery of the current through the load, to provide a desired quantity of charge through the load, or to reduce energy wasted in providing the current through the load.

For example, if the impedance of the load increases or decreases, the voltage of the second quantity of energy may be increased or decreased respectively to provide a uniform amount of charge through the load. If the dielectric constant of the insulator between a conductor of the circuit and the load increases (e.g., length of gap increases) or decreases (e.g., length of gap decreases), the voltage of the first quantity of energy may be respectively increased to accomplish ionization or decreased to accomplish ionization at a lower voltage. If a conductor of the circuit contacts the load to establish a circuit without ionization, the voltage of the first quantity of energy may be further reduced because ionization is not needed.

A driver may monitor (e.g., detect, observe, measure) one or more characteristics of the first quantity of energy to determine whether ionization occurred. In the event that ionization occurred, the circuit may adjust the characteristics of the first quantity of energy to attempt ionization using less energy. Accomplishing ionization using less energy conserves energy. In the event that ionization does not occur, the circuit may adjust the characteristics of the first quantity of energy to attempt ionization using more energy. The amount of energy of the first quantity of energy may be increased until ionization occurs or until the circuit reaches a maximum amount of energy. Adjustment of one or more characteristics of the first quantity of energy may be performed for each attempt at ionization.

A driver may monitor the characteristics of the second quantity of energy. Such a circuit may monitor the second quantity of energy to determine whether a desired amount of charge was delivered to the load. A desired amount of charge may be an amount of charge for accomplishing the desired effect of causing skeletal muscle contractions. In the event that that the current does not deliver an effective amount of charge to the load, the circuit may adjust the characteristics of the second quantity of energy to provide additional energy to the load to increase the amount of charge provided through the load. In the event that that the current provides more than an effective amount of charge to the load, the characteristics of the second quantity of energy may be adjusted to provide less energy to the load to decrease the amount of charge provided through the load. Adjusting the characteristics of the second quantity of energy to deliver an effective amount of charge improves uniformity of delivery of charge through the load. Adjusting the characteristics of the second quantity of energy further conserves energy by using only the amount of energy needed to deliver an effective amount of charge. An effective amount of charge may be an amount of charge to accomplish stimulation of the skeletal muscles of a human or animal target to interfere with locomotion by the target.

A status of contact of a conductor of a driver to the load may determine the quality of the electrical coupling between the driver and the load. The quality of an electrical coupling may determine whether ionization was accomplished. The quality of an electrical coupling may determine whether an effective amount of charge was delivered through the load. A conductor of a driver may electrically couple to a load by ionization of air in a gap between the conductor and the load. A conductor may electrically couple to a load by contact with a conductive portion of the load. A conductor that contacts a conductive portion of a load may provide a current through the load without ionization. A conductor may electrically couple to a load by resistive contact with a conductive portion of the load. A conductor that contacts a conductive portion of a load may provide a current through the load with little or no ionization.

The characteristics of a first quantity of energy, the characteristics of a second quantity of energy, and an amount of charge delivered through the load may be used to determine the status of an electrical coupling between a conductor of the driver and a load. The status of an electrical coupling between a conductor of the driver and the load may include good contact, partial contact, and no contact. Good contact may include direct contact between a conductor of the circuit and a conductive portion of the load. Good contact may include ionization of air in a gap between the conductor and the load. Ionization of air in a gap having a characteristic of good contact may be accomplished at a lower multiplied voltage (e.g., 12,000V-28,000V). An electrical coupling having a status of good contact enables the circuit to provide a range of amounts of charges through the load including an effective amount of charge.

Partial contact may include contact between a conductor of the circuit and a less conductive portion of the load. Partial contact may include ionization of air in a gap between the conductor and the load. Ionization of air in a gap having a characteristic of partial contact may be accomplished at a higher voltage (e.g., 28,000V-56,000V). An electrical coupling having a status of partial contact enables the circuit to provide a range of amounts of charges through the load including an effective amount of charge. Current provided to a load after ionization via a connection having partial contact may need to be delivered at a higher voltage to maintain ionization and/or to provide a desired amount of charge to the load.

No contact may include contact of a conductor of the circuit with a non-conductive portion of the load. No contact may include separation of the conductor from the load by such a distance as to preclude ionization of air in the gap even at a relatively high voltage. No contact may further include a short-circuit between two conductors of the circuit thereby precluding establishing a circuit through the load. An electrical coupling having a status of no contact does not enable delivery of an effective amount of charge through the load.

A change in the electrical coupling between the circuit and the load may affect delivery of a current through the load. The characteristics of the first quantity of energy and the second quantity of energy may be adjusted responsive to a change in the status of the electrical coupling.

A driver may provide a notice of a status of an electrical coupling. A notice may include an audible or visual indication of the status of the electrical coupling. A notice may be provided to a user of the circuit. The user may take an action responsive to the notice.

System 100 of FIGS. 1-5 may perform the functions of a driver that provides a current through a load as discussed above. System 100 may ionize air in a gap to establish a circuit through a human or animal target. System 100 may delivery an effective amount of charge through a target. An effective amount of charge provided by system 100 may interfere with locomotion by the target. According to various aspects of the present invention, System 100 may monitor stored energy and delivered charge for several purposes, including to determine a status of an electrical coupling of system 100 to a load.

An apparatus of the present invention may include a circuit that provides a current to a load as discussed above. For example, system 100 of FIG. 1 may include a hand-held, gun-type remote stun electronic weapon that delivers a series of pulses through a load 102. During each pulse, a current is conducted through load 102. Between pulses, substantially no current flows through load 102. Ionization may be necessary to establish the current for one or more pulses. The apparatus may provide a predetermined number of pulses per unit time by adjusting respective times between pulses, for example, to account for incomplete attempts at ionization.

Figure 1:
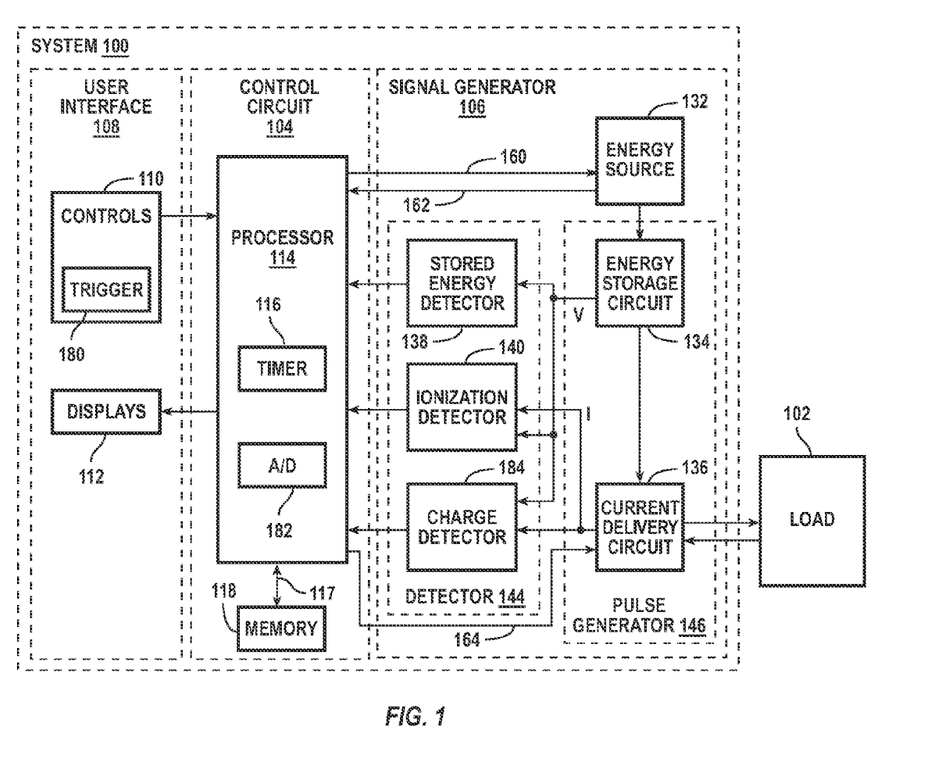
FIG. 1 is a functional block diagram of an apparatus for driving an isolated load and determining a status of the electrical coupling to the load according to various aspects of the present invention.

Load 102 may include a human or animal target as described above in a conventional environment. Load 102 represents static and time varying conditions (e.g., clothing, weather, movement, body chemistry, aggressiveness).

As discussed above, ionization of a path in a circuit having an ionizable path permits a current to flow in the circuit. The current may deliver an effective amount of charge to the load. For an electronic weapon, a desirable effect on a target (e.g., loss of voluntary control of skeletal muscles) may be accomplished with a desired quantity of pulses and a desired amount of charge per pulse is being transferred. Electric charge in motion is electric current. Delivered charge is the integral of delivered current over time. Describing delivery of current through target tissue for a duration subsumes describing delivery of a desired total charge through target tissue.

The functional blocks of FIG. 1 may be implemented as separately identifiable circuits (and/or instructions forming routines performed by a processor) or implemented with multiple function circuitry (and/or processors) in any conventional manner.

A load having an ionizable path provides part of an electrical circuit after ionization of the ionizable path. The part of the electrical circuit includes the load and the path. The ionizable path may involve relatively variable electrical characteristics (e.g., a range of isolations due to various electrode separations, various insulating materials between the electrodes, movement of target relative to an electrode).

System 100 includes control circuit 104, signal generator 106, and user interface 108. Any conventional electronic circuit components and technology including firmware and software may be used to construct system 100. Control circuit 104 includes processor 114, and memory 118. Processor 114 includes timer 116 and analog-to-digital converter 182. Signal generator 106 includes energy source 132, detector 144, and pulse generator 146. Detector 144 includes stored energy detector 138, ionization detector 140, and charge detector 184. Pulse generator 146 includes energy storage circuit 134 and current delivery circuit 136. User interface 108 includes controls 110 and displays 112. Controls 110 include trigger 180.

In various implementations according to the present invention, system 100 and the functional blocks thereof perform the functions of similarly identified functional blocks disclosed in the documents incorporated by reference.

The functional blocks of system 100 may cooperate for closed loop control. Closed loop control includes conventional feedback control technology that effects an adjustment for a future function based, inter alia, upon an effect of a past performance of a related function. For example, feedback may be used to detect whether ionization occurred and adjust the first quantity of energy for a next attempt of ionization. Feedback may be used to detect an amount of charge delivered through the target and to adjust the second quantity of energy for a next delivery of charge. Because current may be delivery as a series of pulses, system 100 may monitor the delivery of a present pulse and use feedback to adjust energy characteristics for the delivery of a next pulse. According to various aspects of the present invention, the information gathered to provide closed loop control may further be used to determine a status of an electrical coupling between system 100 and load 102.

Trigger 180 may start or continue the function of any functional block in a loop (e.g., energy source, energy storage circuit, delivery circuit, ionization detector, and charge detector).

A control circuit controls operation of an apparatus and may perform methods, according to various aspects of the present invention, to determine a status of an electrical coupling of the apparatus to a load. Controlling operation of an apparatus may include providing control signals to, and receiving status signals from, a signal generator. Controlling may also include interacting with a user via a user interface. Actions by control circuit 104 may be coordinated and sequenced by processor 114 with reference to digital timer 116. Timer 116 may be a discrete circuit or packaged with processor 114. Timer 116 provides a reference time base for any or all control signals provided by processor 114.

A processor directs attempting delivery of energy for ionization, delivery of a current, and/or determining a status of an electrical coupling to a load. Delivery of energy for ionization and/or of current pulses may include controlling energy storage, controlling pulse formation, monitoring delivery, and/or adjusting operating parameters for a next attempt to delivery energy for ionization and/or for a next pulse to be delivered.

Monitoring may include detecting an amount of energy stored, an amount of energy released, ionization, and/or an amount of charge provided. Indicia of any such amount and/or occurrence of a condition may constitute a result of monitoring. Determining a status of an electrical connection may include comparing an amount of energy, stored and/or released, to a range of amounts of energy. Determining the status may include comparing an amount of charge delivered to a range of amounts of charge. A range of amounts of change may include a range of effective amounts of charge. Determining may include applying a rule in accordance with comparing to determine a status of an electrical coupling. Determining may further include providing a notice to a user. A notice may be provided to a user via user interface 108. A notice may include an audible or visual notice provided to a user via displays 112.

For example, processor 114 monitors an amount of energy stored or delivered to attempt ionization to establish a circuit through a load. Processor 114 further monitors an amount of charge delivered by a present pulse of current to the load. Indicia of a result of monitoring may be used by processor 114 to determine a status of an electrical coupling. Processor 114 compares indicia of monitoring with stored ranges of voltages and amounts of currents to determine the status of an electrical coupling. Processor 114 cooperates with memory 118 to access ranges for comparison. Processor 114 cooperates with displays 112 to provide notices of a status of an electrical coupling to a user of system 100.

A processor includes any circuit that performs a stored program. For example, processor 114 may include a conventional microprocessor, microcontroller, microsequencer, and/or signal processor. A processor may perform any control function described herein with reference to relative time, time of day, and/or digital or analog signals. Signals received by processor 114 may be in any conventional digital and/or analog format. If signals are in an analog format, processor 114 may include a suitable converter, for example, analog-to-digital converter 184.

Processor 114 operates from a program stored in memory 118. In operation, processor 114 responds to a signal from trigger 180 (e.g., trigger pull) to attempt initialization and deliver a current. Processor 114 controls energy source 132, energy storage circuit 134, current delivery circuit 136, stored energy detector 138, ionization detector 140, and charge detector 184 as described herein, as described in the documents incorporated by reference, and otherwise in any conventional manner. Processor 114 receives signals for monitoring from stored energy detector 138, ionization detector 140, and charge detector 184. Processor 114 uses information received from monitoring to determine a status of an electrical coupling of signal generator 106 to load 102.

A memory cooperates with a processor for performing any function of the processor. Memory operations include storing program instructions, retrieving instructions for execution by the processor, and storing fixed and variable data used by the processor. For example, memory 118 receives data from and provides data to processor 114. Memory 118 may store an algorithm and/or data for determining a status of an electrical coupling to a load. For example, memory 118 may also store information concerning ranges of voltages and delivered charge for determining a status of an electrical coupling to a load.

Memory may include any conventional type of semiconductor memory including programmable memory. For example, memory 118 includes circuits for ROM, RAM, and flash memory. Memory 118 may also be implemented with semiconductor, magnetic, and/or optical memory technology.

Memory 118 and processor 114 may be formed on one substrate. System 100 may include an interface 117 for external access to processor 114 and/or memory 118 for exchanging information. Access may be accomplished using any conventional interface and communication protocol (e.g., wireless, internet, cell phone).

A signal generator provides, in response to a control circuit, the output voltages and currents of the apparatus for accomplishing the functions of the apparatus with respect to the load. A signal generator may further provide one or more signals used by the control circuit for controlling the signal generator, detecting a status of an electrical coupling between the apparatus and a load, and/or for providing notices to an operator of the apparatus via a user interface.

For example, signal generator 106 provides to control circuit 104 information describing the energy resources available for signal generator 106, information regarding stored energy, information describing an attempted ionization, and information describing charge delivered. Further, signal generator 106, in response to control circuit 104, provides a pulse or a series of pulses sufficient for impeding locomotion by a target, as discussed above. Impeding locomotion may include halting locomotion. Signal generator 106 stores energy for one or more pulses and delivers energy from storage for each pulse of a series.

An energy source provides energy for providing a current through a load. An energy source may also provide energy to the circuits of system 100. An energy source may include any conventional circuitry for receiving, converting, and delivering energy suitable for signal generating functions. An energy source may include a battery and low voltage regulators and/or conventional power supply circuitry so that suitable voltages and currents may be supplied by the energy source to any functions of the signal generator and the apparatus. An energy source may deliver energy to an energy storage circuit. An energy source may provide a first quantity of energy and a second quantity of energy as discussed above.

For example, energy source 132 includes a battery, a relaxation oscillator, and a high voltage power supply (e.g., from about 100 volts to about 50,000 volts) operated from the battery. Energy source 132 may include a voltage conversion circuit (e.g., a power supply, a transformer, a dc-to-ac converter, a dc-to-dc converter). Energy source 132 may consist essentially of a precharged capacitor (e.g., charged before launch of an electrified projectile).

In operation, energy source 132 receives start information from processor 114 to provide energy (e.g., a pulse or series of pulses) to an energy storage circuit. For example, in response to control signals 160, energy source 132 supplies power to pulse generator 146 of signal generator 106. Processor 114 may control the magnitude, duration, and/or time separation (e.g., repetition rate) of pulses generated by pulse generator 146 to a target by way of controlling energy source 132 (e.g., on/off control of the conversion function). Energy source 132 may receive adjustment information (e.g., control signals) from processor 114. Adjustment information may describe any aspect of energy supply. Adjustment information may be based on monitoring delivery of a previous pulse.

A pulse generator delivers a signal intended to provide current through a load having an ionizable path. If the signal is not sufficient for ionization of the path, then substantially no current is delivered. Conversely, if ionization is achieved, current may be delivered through the load while the ionized path exits. A pulse generator may provide status signals to a control circuit and/or receive control signals from a control circuit. In addition to forming pulses of voltage and/or current versus time, a pulse generator may perform energy conversion so that the current is delivered at a voltage different from the voltage of the energy supplied to it.

A pulse generator may receive one or more signals from a control circuit so that pulse generation is responsive to any inputs and/or methods of the control circuit. For example, pulse generator 146 receives energy from energy source 132 as a series of pulses having a peak voltage of 3800 volts. Pulse generator 146 stores energy by incrementally charging one or more capacitances in an energy storage circuit 134. When an output pulse is to be delivered, pulse generator 146 delivers energy from energy storage circuit 134 at one or more voltages via a current delivery circuit 136.

An energy storage circuit receives energy from a source and stores energy at the same or a different voltage (e.g., voltage multiplier, doubling circuits, transformer) as provided by the source (e.g., charges a capacitance). An energy storage circuit provides energy from storage (e.g., discharges a capacitance) to form a current through a load as discussed above. The energy storage circuit may receive energy from an energy source in the form of pulses of energy as discussed above. An energy storage circuit may store any number of quantities of energy. Each quantity of energy may be stored at a different voltage. For example, a first quantity of energy may be stored on a first capacitance and a second quantity of energy may be stored on a second capacitance.

An energy storage circuit may provide indicia of an amount of energy stored (e.g., a voltage across a capacitance) for each quantity of energy stored. For example, storing energy in energy storage circuit 134 includes charging a capacitance. Releasing energy from energy storage circuit 134 includes discharging the capacitance. Energy storage circuit 134 may charge and discharge any number of capacitances. Processor 114 may provide control signals for charging and discharging capacitances of energy storage circuit 134.

Energy storage circuit 134 provides indicia corresponding to the amount of energy presently stored. Energy storage circuit 134 may provide indicia for each quantity of energy stored. For example, one or more signals V may provide to detector 144 at any time an indication of the extent (e.g., present amount) of stored energy for one or more quantities of stored energy. Signal V may correspond to a voltage across the one or more capacitances discussed above. Signal V may also indicate the extent of a current delivery function (e.g., voltage across the capacitance at any time after discharging began) for the one or more capacitances.

Energy storage circuit 134 may include, for example one or more capacitances charged to the same or different voltages. Energy storage circuit 134 may further include one or more switches controlled by processor 114 for governing energy storage and/or release of stored energy. Energy storage circuit 134 may store energy for one pulse and release energy to form one pulse for delivery through a target. Energy storage circuit 134 may include circuits for storing and releasing energy for more than one pulse or discontinuously releasing energy for a series of pulses. Energy storage circuit 134 may include multiple capacitances, for example, one capacitance for each pulse of a series. Energy storage circuit 134 receives energy from energy source 132 and provides energy to current delivery circuit 136. Energy storage circuit 134 may provide indicia of stored charge to charge detector 184 (e.g., signal V as discussed above). Energy source 132 may delivery energy to energy storage circuit in the form of one or more pulses of energy. Each pulse of energy from energy source 132 tends to increase the energy stored in the energy storage circuit until the voltage of the capacitance reaches the voltage of the received energy pulses.

A current delivery circuit receives energy from an energy storage circuit and releases energy into a load (e.g., a target). A current delivery circuit of an apparatus provides energy for ionization and energy for delivery of a current through the load after ionization. Electrical energy is provided as a current having voltage. Current, of course, conveys charge. A current delivery circuit may provide indicia of current delivery through a load (e.g., measured current). A current delivery circuit may perform an energy conversion function. For example, receiving energy from an energy storage circuit may include converting the energy received to a different form (e.g., higher voltage). Energy for the current may be delivered at a voltage lower than a voltage sufficient for ionization. The source impedance of a current delivery circuit may be relatively high for delivery of energy for ionization and relatively low for delivery of energy for the current through the load after ionization. Current delivery (e.g., releasing energy) may include establishing a path for the delivery of energy to a load (e.g., ionizing air in a gap), detecting whether a load is present, and detecting whether a path is formed (e.g., detecting a relatively low path resistance). Providing or releasing energy from a capacitance may include discharging the capacitance into the load or into a circuit coupled to the load. A current delivery circuit electrically couples to a load to deliver a current to the load.

A current delivery circuit may perform the functions of initiating and aborting current delivery for ionization and/or delivery of stimulus current through target tissue. The functions of a current delivery circuit may be responsive to one or more signals from a control circuit. For example, current delivery circuit 136 receives energy from energy storage circuit 134 and delivers energy to load 102 in response to control signals 164 from processor 114. If an attempt at ionization fails, energy for ionization and/or delivery of current may remain unused in energy storage circuit 134 and/or current delivery circuit 136; or be consumed in whole or in part by current delivery circuit 136. Preferably, if an attempt at ionization fails, most of the energy that would have been consumed if ionization had been successful is conserved for a future attempt and substantially all of the energy for the current that would have been delivered after successful ionization is conserved for a future attempt.

In applications where a load is in series with a current delivery circuit, providing indicia of current delivery to the load may include providing indicia of a current in the series circuit. Providing indicia of current may include providing a proportional current that indicates an amount of current delivered to the load. A delivery circuit may distinguish between energy used for path formation (e.g., one or more arcs) and other energy delivered to a load.

For example, current delivery circuit 136 receives energy from energy storage circuit 134, provides energy to load 102, and provides indicia of current delivery to charge detector 184. Charge detector 184 may monitor a signal I for a period of time. Signal I indicates a current flowing in current delivery circuit 136 for delivery to a load. By integrating signal I for the period of time, current delivery circuit 136 provides indicia of a quantity of charge delivered through the load. Current delivery 136 may include a step-up transformer for providing an ionization voltage for path formation. Path formation may occur across one or more gaps.

A detector includes any circuit that provides status information to a control circuit. Status information may include indications of quantity, indications that a limit has been reached, or merely indicia that status has changed (e.g., where processor 114 may adequately determine quantitative information based on prior control signals and/or elapsed time).

For example, stored energy detector 138 and charge detector 184 monitor pulse generator 146 to provide signals describing an amount of energy stored by energy storage circuit 134 and an amount of charge provided by current delivery circuit 136 through load 102.

Monitoring an energy storage circuit may include monitoring a voltage of one or more capacitances. The energy stored in a capacitance is generally given by the expression $E=\frac{1}{2}CV^2$ where E is energy in joules, C is capacitance in farads, and V is the voltage across the capacitance in volts. The voltage across the capacitance is consequently an indication of an amount of energy stored. Further, a change in voltage across the capacitance corresponds to a change in stored energy. Charging refers to increasing the quantity of charge stored in a capacitance and as the quantity of charge increases, so does the voltage across the capacitance. Discharging refers to removing charge from a capacitance. As current is removed from a capacitance, the integral of the current gives the quantity of charge delivered.

For example, stored energy detector 138 may include a voltage divider and/or comparator that provides one or more logic signals to processor 114 when a voltage of a capacitance of energy storage circuit 134 exceeds one or more limits. When energy storage is a predictable function of elapsed time, processor 114 may interpret an output of timer 116 as an indication of stored energy and stored energy detector 138 may be omitted.

An ionization detector detects ionization of air in one or more gaps in series with a load. Since prior to ionization substantially no current flows in the load, detecting ionization may include detecting a current in the load and/or detecting discharge of a capacitance that provided a voltage for ionization. For example, ionization detector 140 may include a voltage divider and/or comparator that provides a logic signal to processor 114 when a voltage of a capacitance of energy storage circuit 134 that provides energy for ionization is charged, being discharged or was discharged.

Processor 114 may include an integral analog-to-digital converter that may perform the voltage monitoring function discussed above.

A charge detector indicates an amount of charge delivered through a load. The amount of charged delivered may be understood from analysis of signals provided to the charge detector. By detecting charge delivered, a system according to the present invention detects a factor used to determine the status of the electrical coupling between the apparatus and the load as discussed above.

A charge detector may receive a signal indicating an amount of energy currently stored in an energy storage circuit. The charge detector may analyze the amount of energy stored before and after delivery to provide an indication of an amount of charge delivered through a load. A charge detector may integrate a voltage or a current for a period of time to detect an amount of charge delivered through a load. Integrating is preferred in applications where pulse shape varies.

For example, system 100 may include circuits with only signal I, only signal V, or both signals I and V. Charge detector 184 may monitor signal I for a period of time. Signal I indicates a current flowing in current delivery circuit 136 for delivery to a load. By integrating signal I for the period of time, charge detector 184 provides indicia of a charge delivered to a load. Charge detector 184 may receive a signal V. Signal V indicates an amount of energy presently stored by energy storage circuit 134. By subtracting the amount of energy stored by a charging step from the amount of stored energy remaining after a discharging step, charge detector 184 computes a difference in energy and relates the difference to an amount of charge delivered to a load.

Charge detector 184 may include a subtraction circuit that indicates the difference between energy stored in energy storage circuit 134 before delivery and energy remaining in energy storage circuit 134 after delivery. The subtraction circuit may include analog technology (e.g., sample-hold) and/or digital technology.

Charge detector 184 may include a shunt (e.g., resistor) in series with load 102 for monitoring a current through the load (e.g. as a voltage across the shunt) and an integrator that provides indicia of charge as an integral of a current through the shunt. Integration of the current (or voltage) may be performed over a period that includes a duration of time before, during, and/or after delivery of a current to load 102.

Processor 114 may perform one or more of the functions of charge detector 184 by incorporating suitable signal processing technology.

A user interface may be implemented with any conventional input technology including manual switches, touch sensitive panels (e.g., displays), and/or proximity switches (e.g., presence of user identification enabling operation). A user interface may be implemented with any conventional output technology (herein generally referred to as a display) including vibration, audio tones, voice messaging, colored lighted indicators, text displays, and/or graphics displays.

Controls of a user interface for an apparatus may provide signals to request status, change configuration of the apparatus, and/or initiate or terminate any system function. For example, controls 110 include a manually operated safety switch, a manually operated trigger switch, and a manually operated mode switch that provide signals to processor 114 for enabling a local stun function, enabling a remote stun function, and performing any conventional configuration management of an electronic weapon. Controls 110 includes trigger 184.

A trigger receives an external input. An external input to a trigger may be provided by a user and/or a target. Trigger 184 provides indicia of a trigger pull to system 100. Responsive to the trigger, system 100 may, inter alia, initiate a launch as described in the documents incorporated by reference, attempt ionization, deliver a pulse of current, deliver a series of pulses of current, and/or report a status of an electrical coupling to a target. A trigger may provide a signal to the processor to start or continue a desired function. For example, trigger 184 includes any circuit having a detector (e.g., switch, trip wire, beam break, motion sensor, and vibration detector) for detecting an input from a user and for generating a signal received by processor 114. A trigger may initiate or control an adjusting function of system 100. A trigger may initiate or control a monitoring function of system 100.

Displays of a user interface for an apparatus may provide information describing status and/or configuration of the apparatus. For example, displays 112 may include a status of an electrical coupling to a target for providing a current through the target. For instance, system 100 may perform a remote or a local stun function when the status of the electrical coupling is indicated as "contact" or "partial contact."

System 100 may include a launcher or propellant (not shown). The launcher or propellant may propel all or a portion of system 100 toward a target (e.g., load). For example, a portion propelled toward a target may include an electrode and a conductive tether that couples the electrode to a delivery circuit retained with the launcher. The portion propelled may include a non-tethered (e.g., wireless) projectile comprising, all or portions of energy source 132, energy storage circuit 134, current delivery circuit 136, stored energy detector 138, and/or charge detector 184. In the case of a wireless projectile, providing indicia of stored energy and charge delivered through the load may include wireless communication of the indicia from the projectile to circuits retained with the launcher (e.g., a base portion (not shown) of system 100). Status of the electrical coupling may be determined with reference to the coupling of the launched portion to the target to deliver the current.

System 100 may perform the methods for adjusting stored energy for ionization and delivery of an amount of charge through a load as discussed in the documents incorporated by reference. System 100 may further perform methods for determining a status of an electrical coupling between system 100 and load 102.

Methods performed by an apparatus according to various aspects of the present invention may determine a status of an electrical coupling between the apparatus and a load. Information regarding status of the electrical coupling may be used by a user of the apparatus to determine whether to attempt to improve the electrical coupling prior to attempting to provide current through the target. For example in the case of a local stun, a user may improve the status of the present electrical coupling by repositioning the terminals of the apparatus with respect to the target. Repositioning may include moving the terminals of the apparatus closer to the target and/or pressing the terminals into target tissue. In the case of a remote stun, a user may launch additional wire-tethered electrodes and/or wireless electrified projectiles to establish a new coupling that has a status that is better for providing current than a present status.

Figure 2:
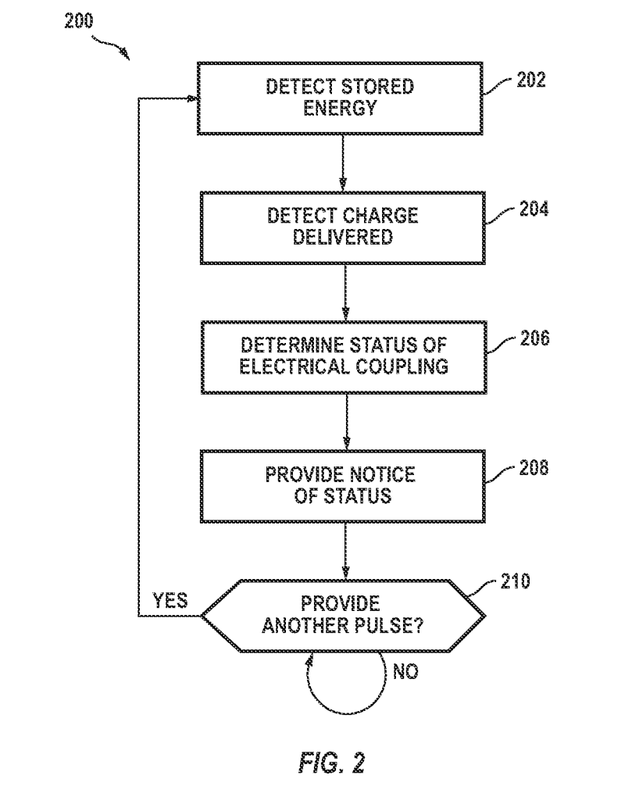
FIG. 2 is a process flow diagram of a method, according to various aspects of the present invention, for determining a status of an electrical coupling to a load.

For example, a method 200 of FIG. 2 is performed by processor 114 for detecting a status of an electrical coupling between system 100 and load 102. Method 200 includes detect stored energy process 202, detect charge delivered process 204, determine status of electrical coupling process 206 (herein determine status process), provide notice of status process 208, and provide another pulse process 210. Interprocess communication may be accomplished in any conventional manner (e.g., subroutine calls, pointers, stacks, common data areas, messages, interrupts). As desired, any of the processes of method 200 may be implemented in circuits of functional blocks other than control circuit 104.

Method 200 may be performed in a multitasking operating system environment where each process performs whenever sufficient input data is available. In other implementations, processes may be performed in a sequence similar to that described below. Multiple apparatus may be operated from one method if performed in an operating system environment that supports multithreaded execution (e.g., one thread, context, or partition for each apparatus).

Method 200 receives information, determines the status of the electrical coupling of current delivery circuit 136 to load 102, and provides a notice of the status. Status may be determined for each pulse of current provided to a target. Status may be determined on a per pulse basis because the electrical coupling between a terminal or electrode of system 100 and a target is subject to change (e.g., electrodes lodged in clothing move with respect to target tissue as the target intentionally moves or falls).

On receipt of a start signal (e.g., generated by a trigger pull), detect stored energy process 202 detects energy stored by energy storage circuit 134 for providing a current through a target. Energy storage circuit 134 may store a first amount of energy for attempting ionization of air in a gap in series with the target. Energy storage circuit 134 may store a second amount of energy for providing an amount of charge through the target. Detect stored energy process 202 detects the first amount of energy and the second amount of energy. Detecting an amount of energy may include detecting a voltage across a capacitance. A voltage across a capacitance may provide indicia of an amount of energy stored in the capacitor. Detect stored energy process 202 may detect stored energy after energy storage circuit 134 has received an amount of energy for storage, but prior to release of the energy to provide a current through the target. Because the amount of energy stored by energy storage circuit 134 may be adjusted on a per pulse basis, as discussed in the documents incorporated by reference, detect stored energy process 202 may be performed for each pulse.

As current delivery circuit 136 attempts to deliver a current through the target, detect charge delivered process 204 detects the amount of charge delivered to the target. As discussed above, charge detector 134 determines the amount of charge provided through the target. Because the amount of charge provided through a target may be adjusted on a per pulse basis, as discussed in the documents incorporated by reference, detect charge delivered process 204 may be performed for each pulse. Detecting an amount of charge delivered may include receiving indicia of charge delivered from charge detector 184. Indicia of charge delivered may include a value of the number of microcoulombs of charge provided to the target.

Information detected by detect stored energy process 202 and/or detect charge delivered process 204 may be stored on a temporary basis for use by determine status process 206. Information detected by detect stored energy process 202 and/or detect charge delivered process 204 may be further stored as a historical record (e.g. or log).

Using information detected by detect stored energy process 202 and detect charge delivered process 204, determine status process 206 may determine the status of the electrical coupling between an apparatus and a load. As discussed above the status of an electrical coupling may include good contact, also referred to as contact, partial contact, and no contact. According to various aspects of the present invention, determination of a status of an electrical coupling may be based on empirical data that relates energy stored for ionization, energy stored for stimulation, and charge delivered to a target to the quality of the electrical coupling between an apparatus and a target. Determination of status may be accomplished by measuring an impedance of the connection between the apparatus and the target. Using a table that relates voltages and current delivered to quality of the connection avoids the step of calculating impedance. Using values empirically measured further provides a method for determining the status of a connection that relates to actual results of the apparatus with respect to impeding locomotion by the target. Accordingly, determine status process 206 uses, in a preferred implementation, at least one table of empirical values.

Figure 3:
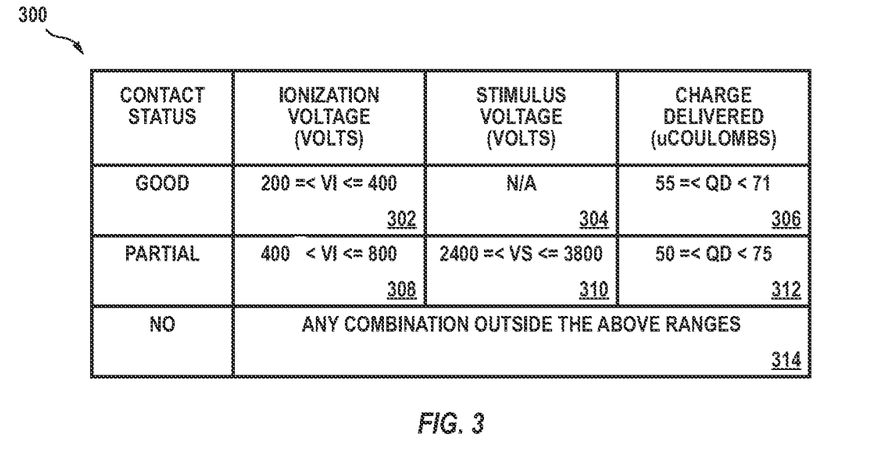
FIG. 3 is a table of ranges, according to various aspects of the present invention, for determining a status of an electrical coupling to a load.

Table 300 provides empirical data for determining the status of an electrical coupling. Cells 302, 304, and 306 of table 300 provide the detected conditions that relate to good contact between the apparatus and the target. Cells 308, 310, and 312 of table 300 provide the detected conditions that relate to partial contact between the apparatus and the target. Cell 314 of table 300 provides the detected conditions that relate to no contact between the apparatus and the target.

As discussed above, good contact may include direct contact with a target or ionization at a lower voltage (e.g., relative to partial contact) to establish an ionization path to the target. A terminal of an electronic weapon may be pressed against or embedded into tissue of a target to perform a local stun. A wire-tethered electrode or projectile may be launched to establish direct contact with target tissue. A terminal or electrode may also be positioned proximate to target tissue such that a gap of air exists between the terminal or electrode and target tissue. Ionization may establish an ionization pathway of low resistance suitable for delivering a desired amount of charge through the target. After ionization, a current provided at a voltage may deliver the charge.

In an implementation, determine status process 206 detects good contact when the apparatus providing the current operates with in the ranges shown in cells 302, 304, and 306 of table 300. Cell 304 establishes that the magnitude of the stimulus voltage is not a factor in determining good contact, so the determination of good contact depends on the value of the ionization voltage ("VI") and the amount of charge provided through the target. An electronic weapon determines that the status of the electrical coupling between the weapon and the target is good when VI and the amount of charge delivered falls within the respective values shown in cells 302 and 306.

Cell 302 establishes a range for VI prior to multiplication for determining good contact. VI may be multiplied to provide a voltage capable of ionizing air in a gap of up to one inch. A value of VI that falls within the range of 200 to 400 volts indicates good contact. The multiplier factor may be in the range of 60-70 times. The multiplied ionization voltage for good contact may range from 12,000 volts to 28,000 volts. Cell 306 establishes a range for the amount of charge provided to the target for determining good contact. Delivery of an amount of charge between 55 microcoulombs and 71 microcoulombs indicates good contact. As discussed above, the stimulus voltage ("VS") is not a factor in determining good contact.

Determine status process 206 detects partial contact when the apparatus providing the current through the target operates within the ranges shown in cells 308, 310, and 312 of table 300. The electronic weapon determines that the status of the electrical coupling between the weapon and the target is partial contact when VI, VS, and the amount of charge delivered falls within the respective values shown in cells 308, 310, and 312.

Cell 308 establishes a range of between 400 volts and 800 volts for VI prior to multiplication for partial contact. The relatively higher voltage for VI indicates that an increased magnitude of the ionization voltage is needed to establish an ionization path. Cell 312 establishes a range of between 2,400 volts and 3,800 volts for VS for partial contact. Cell 312 establishes a range of 50 microcoulombs to 75 microcoulombs of the amount of charge through the target for partial contact.

Any values for VI and the amount of charge outside of the ranges established by cells 302 and 306 indicates an absence of good contact. Any values for VI, VS, and the amount of charge outside of the ranges established by cells 308-312 indicates an absence of partial contact. As represented by cell 314 of table 300, any value outside the ranges established for good and partial contact indicates no contact. For example, the status of the electrical coupling is no contact when VI is less than 200 volts or greater than 800 volts. The status of the electrical coupling is no contact when the amount of charge is less than 50 microcoulombs or greater than 75 microcoulombs.

For various implementations according to the invention, the ranges of table 300 may be established by empirical data collected through observation and/or measurement. In one implementation, electrodes were embedded into, placed on the surface of, and positioned at various distances (e.g., ¼ inch, ½ inch, ¾ inch, 1 inch) away from meat (e.g., an animal carcass). The voltages and charge provided through the meat for each positioning of the electrodes was recorded. The positions of the electrodes were correlated to the voltages and charges delivered to establish ranges for good contact, partial contact, and no contact. In another implementation, the electrodes of an electronic weapon were positioned relative to live human subjects while recording the voltages and charges delivered to the live subject. The positions of the electrodes were correlated to the voltages and charges delivered to establish ranges for good contact, partial contact, and no contact.

Implementations of the functions described above with reference to FIGS. 1-5 may include a power supply for providing energy (e.g., programmable, switched-mode, battery), capacitors for storing energy (e.g., capacitors for path formation and/or stimulus), switches (e.g., spark gap components, semiconductor switches, transistors (IGBJTs), rectifiers (SCRs)), transformers for energy conversion (e.g., voltage step up), controllers for controlling processes, an integrator for detecting a charge, a shunt circuit for detecting a current provided through a load, and a trigger for initiating or continuing operation. For example, circuit 400 of FIG. 4 may be included in any apparatus for current delivery as discussed above.

Figure 4:
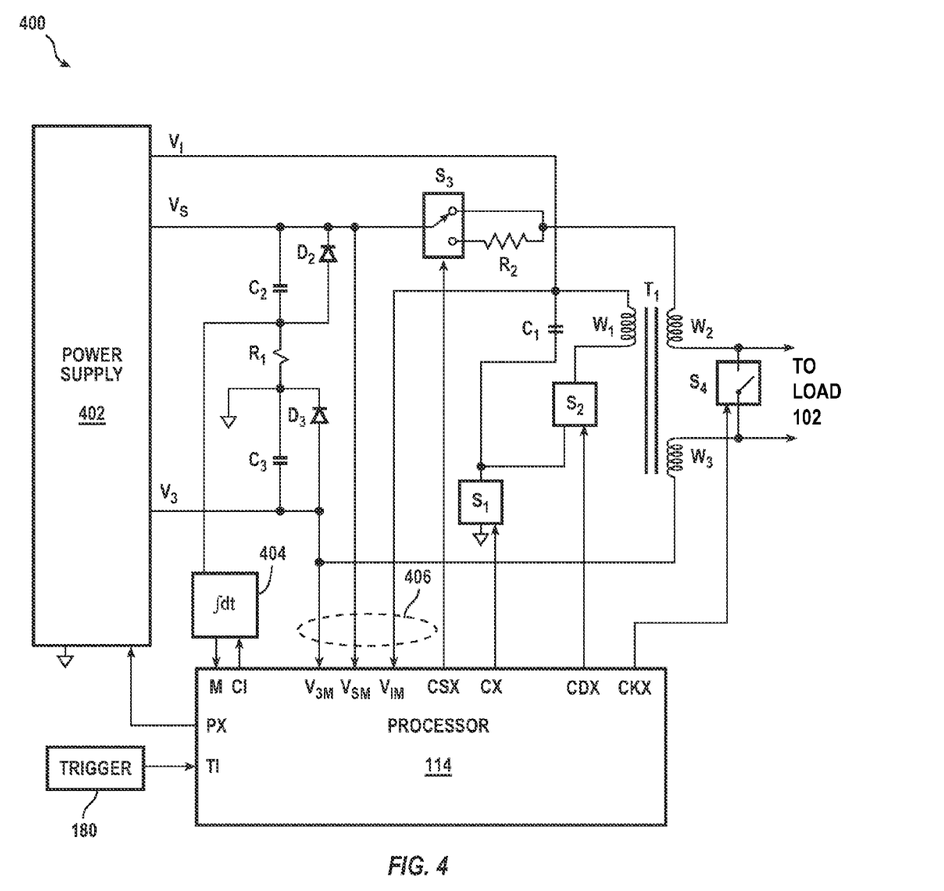
FIG. 4 is a schematic diagram of a circuit for an implementation of the apparatus of FIGS. 1-3.

Functions of energy source 132 are provided by power supply 402 and processor 114. Power supply 402 is a programmable power supply that charges path formation (e.g., ionization) capacitor C1 and charges stimulus capacitors C2 and C3. Processor 114 controls charging by monitoring signals VIM, VSM, and V3M and directing power supply 402 (e.g., via signal PX) to discontinue charging when a respective limit condition is reached (e.g., a stop voltage indicated by signal one or more of signals VIM, VSM, and V3M).

Functions of energy storage circuit 134 are provided by path formation capacitor C1, switches S1 and S2, stimulus capacitors C2 and C3, and processor 114. Processor 114 closes switch S1 and opens switch S2 to charge capacitor C1.

Before load 102 completes a circuit with the secondary windings W2 and W3 of transformer T1 (e.g., before ionization forms a circuit with or without a target), capacitors C2 and C3 may be charged.

Functions of current delivery circuit 136 are provided by transformer T1, switches S1 and S2, capacitors C1, C2, C3, diodes D2 and D3, and shunt resistor R1. Transformer T1 has one primary winding W1 and two secondary windings W2 and W3. After charging, capacitors C1, C2, and C3 and when a stimulus current is to be delivered, processor 114 opens switch S1 and closes switch S2 to start current flow from capacitor C1 into primary winding W1. Current in winding W1 induces a current in secondary windings W2 and W3 at a voltage sufficient to form an arc (e.g., ionize air in a gap) to establish a path through load 102 (e.g., a target). Ionization of air in the gap permits current to discharge from capacitors C2 and C3 through load 102. Energy stored in capacitor C1 is released by discharging capacitor C1. A portion of the energy released is temporarily stored by transformer T1 as a magnetic field. After capacitor C1 substantially discharges, the magnetic field of transformer T1 collapses. The collapsing magnetic field releases energy to continue the current through windings W2 and W3, load 102, D3, R1, and D2. Shunt resistor R1 is in series with the load. Diodes D2 and D3 provide a bypass circuit around capacitors C2 and C3 respectively, especially for conducting current continued by the collapsing magnetic field of secondary windings W2 and W3. Accordingly, the current that flows through the load also flows through resistor R1 providing a signal proportional to current for integration over time. Energy of the collapsing magnetic field (monitored by monitoring the current) consequently contributes to the charge delivered through the target.

Transformer T1 in one implementation consistent with the ranges of FIG. 3 comprises a primary winding of 27 turns, and two secondary windings of 1280 turns each. The primary winding has an inductance of 6.0 microhenries. Each secondary winding has an inductance of 20 microhenries.

Functions of charge detector 184 are provided by integrator 404, processor 114 and the series circuit through the target that includes, inter alia, resistor R1 and diodes D2 and D3. As discussed above, processor 114 may detect voltage values after a charging function and a discharging function for detecting an amount of current delivered; however, doing so does not account for the substantial energy delivered by the collapsing magnetic field discussed above. Integrator 404 outputs indicia of an amount of charge delivered through load 102 to processor 114. Processor 114 controls operation of integrator 404 (e.g., via signal CI).

Processor 114 performs all function of a processor as discussed above and in the documents incorporated by reference. Conventional signal conditioning circuitry (not shown) may scale signals 406.

Figure 5:
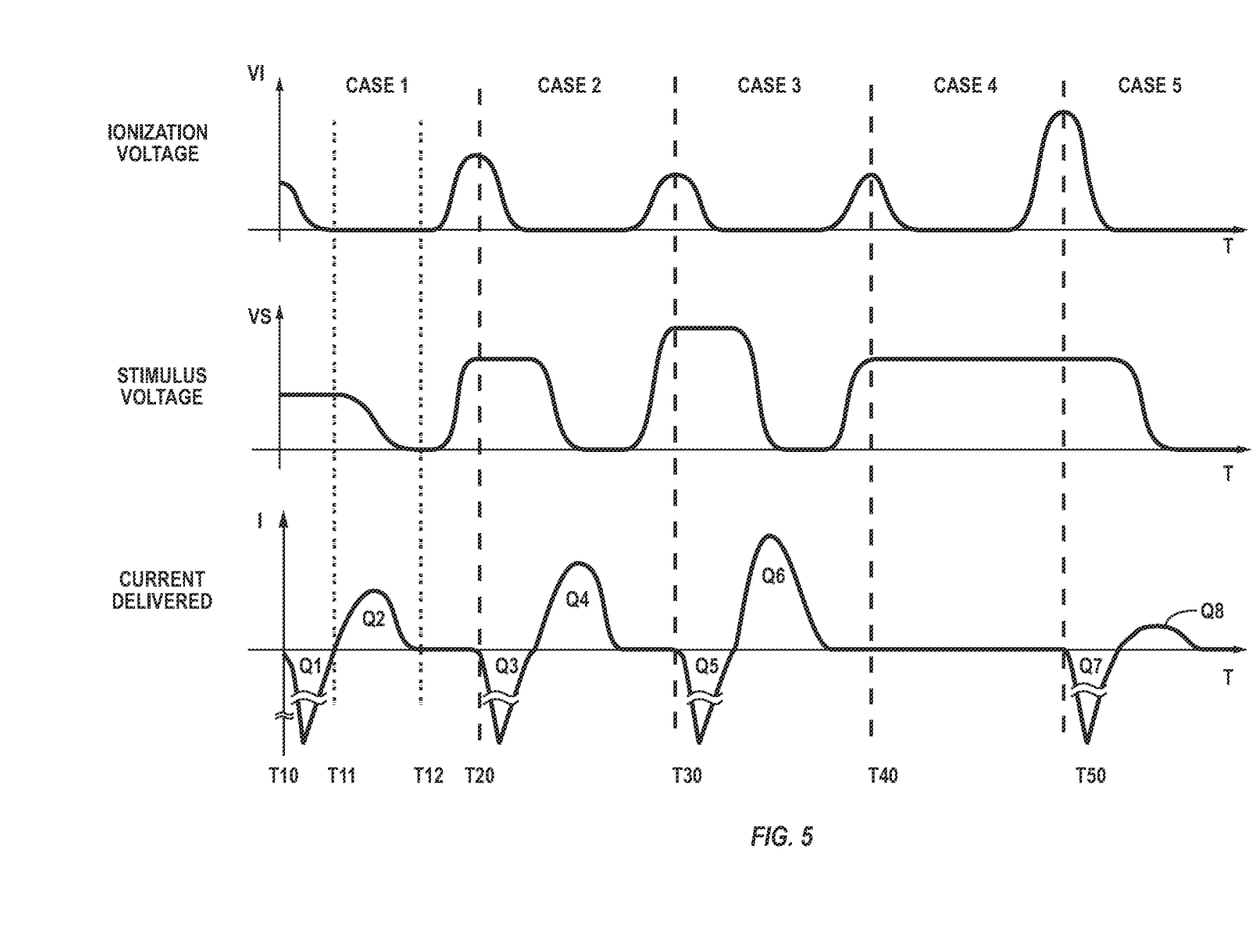
FIG. 5 is a graph of ionization voltage, stimulus voltage, and delivered charge.

The operation of circuit 400 with respect to the ranges of table 300 is shown in FIG. 5. FIG. 5 illustrates the ionization voltage VI, stimulus voltage VS, and charge delivered for five pulses labeled cases 1-5. Each case is discussed with respect to circuit 400 and table 300.

Regarding case 1, at time T10, capacitor C1 is charged to a voltage VI that is about 300 volts while capacitors C2 and C3 are charged to a voltage VS that is about 2,000 volts. Processor 114 measures voltages VI and VS at ports VIM and VSM respectively. Processor 114 may further instruct integrator 114 to start integration of the current detected through resistor R1.

Just after time T10, processor 114 opens switch S1 and closes switch S2 to discharge capacitor C1 into primary winding W1 of transformer T1. Transformer T1 multiplies the voltage VI to provide a voltage of greater magnitude to attempt ionization of air in any gaps that exist between the secondary windings W2 and W3 and load 102 (e.g., target). In case 1, ionization is successful, so an electrical coupling is establish with the target. Because a portion of the current used to establish the ionization path goes through load 102 as discussed above, integrator 404 detects an amount of charge Q1 as being delivered through the target.

At time T11 after capacitor C1 has substantially discharged, processor 114 switches switch S3 to discharge capacitors C2 and C3 through secondary windings W2 and W3 respectively to deliver a current through the target. The current delivered through the target flows through shunt resistor R1. Integrator 404 monitors the voltage across resistor R1 to detect the amount of charge delivered through the target. In case 1, capacitors C2 and C3 provide an amount Q2 through the target. Integrator 404 informs processor 114 that the amount of charge provided to the target is the sum of Q1 and Q2. In this example, the sum of Q1 and Q2 is about 60 microcoulombs.

Processor 114 uses the voltages as detected for VI and VS prior to ionization and the amount of charge provided by integrator 404 to determine the status of the connection for case 1. Processor 114 compares the values of VI, VS, and Q1+Q2 to the ranges provided in table 300. Processor 114 determines that the ionization voltage VI lies between 200 volts and 400 volts, which is the range for good contact. VS does not lie within the range of 2,400 volts to 3,800 volts, but because the amount of charge lies between 55 microcoulombs and 71 microcoulombs, the value of VS is not used to determine that the connection established during case 1 had good contact.

Although each case 1-5 shows the delivery of a pulse of the current, the cases are not necessarily delivery of sequential pulses, but are used only to illustrate the relationship between VI, VS, amount of charge delivered, and the determination of status of the electrical coupling. The magnitude of the voltages of VI and VS may change due to the adjustment discussed above and in the documents incorporated by reference.

Regarding case 2, at time T20, capacitor C1 is charged to about 450 volts while capacitors C2 and C3 are charged to about 3,100 volts. After the discharge of capacitors C1, C2, and C3, integrator 404 reports the delivery of about 72 microcoulombs of charge (Q3 and Q4) through target 102. Processor 114 compares the voltage and charge values to the ranges of table 300 to determine that the status of the electrical coupling for case 2 was partial contact.

Regarding case 3, at time T30, capacitor C1 is charged to about 380 volts while capacitors C2 and C3 are charged to about 3,900 volts. The discharge of capacitor C1 establishes an ionization path and delivers Q5 microcoulombs of charge to load 102. The discharge of capacitors C2 and C3 deliver Q6 microcoulombs of charge to load 102. In case 3, the sum of Q5 and Q6 is about 80 microcoulombs of charge. Processor 114 compares the voltage and charge values to the ranges of table 300 to determine that the status of the electrical coupling for case 3 was no contact because the amount of charge delivered lies outside the ranges for good contact and partial contact. Delivery of an amount of charge outside the good and partial contact ranges may represent discharge into an object other than a human or animal target or discharge through an ionization pathway between two electrodes of the electronic weapon.

Regarding case 4, at time T40, capacitor C1 is charged to about 350 volts while capacitors C2 and C3 are charged to about 3,100 volts. When processor 114 opens switch S1 and closes switch S2, no ionization path is established, so capacitors C2 and C3 do not discharge. Because the ionization path was not established, no charge was delivered to the target. Processor 114 compares the voltage and charge values to the ranges of table 300 to determine that the status of the electrical coupling for case 4 was no contact because the amount of charge delivered lies outside the ranges for good contact and partial contact.

Regarding case 5, at time T50, capacitor C1 is charged to about 780 volts while capacitors C2 and C3 are charged to about 3,100 volts. The discharge of capacitor C1 establishes an ionization path and delivers Q7 microcoulombs of charge to load 102. The discharge of capacitors C2 and C3 deliver Q8 microcoulombs of charge to load 102. In case 5, the sum of Q7 and Q8 is about 21 microcoulombs of charge. Processor 114 compares the voltage and charge values to the ranges of table 300 to determine that the status of the electrical coupling for case 5 was no contact because the amount of charge delivered lies outside the ranges for good contact and partial contact.

In another implementation, according to various aspects of the present invention, no contact is determined without reference to VI. For instance, when VS (310) and QD (312) are not within expected ranges, processor 114 concludes that electrode status is no contact.

A minimum ionization voltage VI ionizes air in gaps that are included in the design of an electronic weapon in series with the electrode/target gap discussed above. By requiring a minimum ionization voltage VI (e.g. 200F) as in FIG. 3 cell 302 and/or 308, notice of failure to obtain good contact and/or partial contact is given to the operator. Such failure may be attributed to, for example, excessive moisture in the electronic weapon.

The following documents are herein incorporated by references for the teachings disclosed therein without limitation: U.S. Pat. No. 6,636,412 to Smith issued Oct. 21, 2003; U.S. Pat. No. 7,042,696 to Smith issued May 9, 2006; U.S. Pat. No. 7,057,872 to Smith issued Jun. 6, 2006; U.S. Pat. No. 7,631,452 to Brundula issued Dec. 15, 2009; U.S. patent application Ser. No. 11/943,467 to Brundula filed Nov. 20, 2007; U.S. Pat. No. 7,457,096 to Brundula issued Nov. 25, 2008; and U.S. Pat. No. 7,821,766 to Brundula issued Oct. 26, 2010.

Applications for drive circuits according to various aspects of the present invention may includes power distribution, communication, signal switching, igniters for engines and/or furnaces, signal generators, and specific applications for signal generators (e.g., for weapons such as electronic control devices). In the discussion that follows, aspects of the present invention will be described with reference to an electronic control device at least because power conservation may be important in such an application (e.g., a battery powered electronic control device) and an electronic control device conveniently illustrates providing a current through a relatively low impedance load (e.g., animal or human tissue) after ionization.

Electronic control devices may include, for example, contact stun devices, batons, shields, stun guns, hand guns, rifles, mortars, grenades, projectiles, mines, and area protection devices among other apparatus generally suitable for ensuring compliance with security and law enforcement. An electronic control device when used against a human or animal target causes an electric current to flow through part of the target's tissue to interfere with the target's use of its skeletal muscles. All or part of an electronic circuit may be propelled toward the target. Applications of electronic control devices may generally include a local stun function where electrodes fixed to the electronic control device (e.g., a gun or projectile) are proximate target tissue; and a remote stun function where electrodes of the electronic control device are launched away from the electronic control device (e.g., connected by conducting tether wires).

The foregoing description discusses preferred embodiments of the present invention, which may be changed or modified without departing from the scope of the present invention as defined in the claims. Examples listed in parentheses may be used in the alternative or in any practical combination. As used in the specification and claims, the words 'comprising', 'including', and 'having' introduce an open ended statement of component structures and/or functions. In the specification and claims, the words 'a' and 'an' are used as indefinite articles meaning 'one or more'. While for the sake of clarity of description, several specific embodiments of the invention have been described, the scope of the invention is intended to be measured by the claims as set forth below.

What is claimed is:

1. An electronic weapon comprising:
   an energy detector that detects:
      a first voltage of a first stored energy for release to attempt ionization of air in a gap between a provided electrode and a human or animal target, the electrode for providing a current through the target; and
      a second voltage of a second stored energy for release after ionization to provide the current through the target, the current for impeding locomotion by the target;

a charge detector that detects an amount of charge provided by the current from the first stored energy and the second stored energy through the target; and a processing circuit that in accordance with the first voltage, the second voltage, and the amount of charge, selects a state from a set of at least three states to describe an electrical coupling between the electrode and the target, each state of the set describes an electrical coupling between the electrode and the target; and provides a notice of the state; wherein the set of states includes:

a first state that corresponds to a value of the first voltage being between 200 volts and 400 volts and the amount of charge being between 55 microcoulombs and 71 microcoulombs; and a second state that corresponds to a value of the first voltage being between 400 volts and 800 volts, a value of the second voltage being between 2400 volts and 3800 volts, and the amount of charge being between 50 microcoulombs and 75 microcoulombs.

2. The electronic weapon of claim 1 wherein the three states of the set of states are mutually not co-existent.

3. The electronic weapon of claim 1 further comprising a user interface; wherein the processing circuit further provides the notice of the state to a user of the electronic weapon via the user interface.

4. The electronic weapon of claim 1 wherein the processing circuit comprises:

a processor;
a memory coupled to the processor; and
a table stored in memory, the table comprising a first range of values for the first voltage; a second range of values for the second voltage; and a third range of values for the amount of charge; wherein the processor compares a value of the first voltage to the first range, a value of the second voltage to the second range, and the amount of charge to the third range; and
in accordance with comparing, the processor selects the state of the set.

5. The electronic weapon of claim 1 wherein:

the energy detector comprises an analog-to-digital converter;
the processing circuit comprises a processor; and
detecting the first voltage and the second voltage comprises
converting the first voltage to a digital value readable by the processor; and
converting the second voltage to a digital value readable by the processor.

6. The electronic weapon of claim 1 wherein:
the charge detector comprises an integrator and detecting the amount of the charge comprises integrating the current for a time.

7. The electronic weapon of claim 1 wherein the set of at least three states consists of contact, partial contact, and no contact.

8. The electronic weapon of claim 1 wherein the first state indicates that the electrode is in direct contact with target tissue.

9. The electronic weapon of claim 1 wherein the second state indicates that the electrode is proximate to target tissue so that the electrode electrically couples to target tissue via ionization of air in a gap between the electrode and target tissue.

10. The electronic weapon of claim 1 wherein a third state of the set indicates that the electrode is not in direct contact with target issue and is not proximate to target tissue.

11. An electronic weapon comprising:

a signal generator comprising a first capacitance and a second capacitance, the signal generator for providing a current via a provided electrode through a target to impede locomotion of the target, the first capacitance discharges to attempt ionization of air in a gap between the electrode and the target, the second capacitance discharges after ionization to provide the current through the target;

a voltage detector that prior to discharge detects a first voltage across the first capacitance and a second voltage across the second capacitance;

a charge detector that detects an amount of charge delivered by the first capacitance and the second capacitance through the target; and a processing circuit that in accordance with the first voltage, the second voltage, and the amount of charge, selects a state from a set of at least three states to describe an electrical coupling between the electrode and the target, each state of the set describes an electrical coupling between the electrode and the target; and provides a notice of the state wherein the set of states includes:

a first state that corresponds to a value of the first voltage being greater than or equal to 200 volts and less than or equal to 400 volts and the amount of charge being between 55 microcoulombs and 71 microcoulombs; and a second state that corresponds to a value of the first voltage being greater than 400 volts and less than or equal to 800 volts, a value of the second voltage being less than 2401 volts, and the amount of charge being between 50 microcoulombs and 71 microcoulombs.

12. The electronic weapon of claim 11 wherein the three states are mutually not co-existent.

13. The electronic weapon of claim 11 further comprising a user interface; wherein the processing circuit further provides the notice of the state to a user of the electronic weapon via the user interface.

14. The electronic weapon of claim 11 wherein the first capacitance comprises a capacitor.

15. The electronic weapon of claim 11 wherein the second capacitance comprises a capacitor.

16. The electronic weapon of claim 11 wherein the voltage detector comprises an analog-to-digital converter.

17. The electronic weapon of claim 11 wherein the voltage detector comprises an analog-to-digital converter that provides indicia of the first voltage and indicia of the second voltage to the processing circuit.

18. The electronic weapon of claim 11 wherein the charge detector comprises an integrator that:

integrates the current provided through the target for a time to determine the amount of current; and
provides indicia of the amount of current to the processing circuit.

19. The electronic weapon of claim 11 wherein the processing circuit comprises:

a processor;
a memory coupled to the processor; and
a table stored in memory, the table comprising a first range for the first voltage; a second range for the second voltage; and a third range for the amount of charge; wherein the processor compares the first voltage to the first range, the second voltage to the second range, and the amount of charge to the third range; and in accordance with comparing, the processor selects the state of the set.

20. The electronic weapon of claim 11 further comprising a user interface; wherein the processor further provides the notice of the state to a user of the electronic weapon via the user interface.

21. The electronic weapon of claim 11 further comprising the electrode, wherein the electrode comprises a wire-tethered electrode launched toward the target to provide the current.

22. The electronic weapon of claim 11 wherein the set of at least three states consists of contact, partial contact, and no contact.

23. The electronic weapon of claim 11 wherein the first state indicates that the electrode is in direct contact with target tissue.

24. The electronic weapon of claim 11 wherein the second state indicates that the electrode is proximate to target tissue so that the electrode electrically couples to target tissue via ionization of air in a gap between the electrode and target tissue.

25. The electronic weapon of claim 11 wherein a third state of the set indicates that the electrode is not in direct contact with target issue and is not proximate to target tissue.

26. A method performed by a processing circuit of an electronic weapon, the method comprising:
    detecting a first voltage of a first stored energy, the first stored energy for attempting ionization of air in a gap between the electrode and the target;
    detecting a second voltage of a second store energy, the second stored energy for providing after ionization a current via the electrode through the target to impede locomotion of the target;
    detecting an amount of charge provided by the first stored energy and the second store energy through the target;
    selecting a state from a set of at least three states to describe the electrical coupling between an electrode of the electronic weapon and the target in accordance with the first voltage, the second voltage, and the amount of charge, each state of the set describes an electrical coupling between the electrode and the target; and
    providing a notice of the state wherein the set of states includes:
        a first state that corresponds to a value of the first voltage being greater than or equal to 200 volts and less than or equal to 400 volts and the amount of charge being between 55 microcoulombs and 71 microcoulombs; and
        a second state that corresponds to a value of the first voltage being greater than 400 volts and less than or equal to 800 volts, a value of the second voltage being less than 2401 volts, and the amount of charge being between 50 microcoulombs and 71 microcoulombs.

27. The method of claim 26 wherein the three state of the set of states are mutually not co-existent.

28. The method of claim 26 wherein determining the state of the connection comprises:
    comparing a value of the first voltage to a first range of voltages;
    comparing a value of the second voltage to a second range of voltages;
    comparing the amount of charge to a range of charges; and
    in accordance with comparing, selecting the state of the set.

29. The method of claim 26 wherein the set of at least three states consists of contact, partial contact, and no contact.

30. The method of claim 26 wherein the first state indicates that the electrode is in direct contact with target tissue.

31. The method of claim 26 wherein the second state indicates that the electrode is proximate to target tissue so that the electrode electrically couples to target tissue via ionization of air in a gap between the electrode and target tissue.

32. The method of claim 26 wherein a third state of the set indicates that the electrode is not in direct contact with target issue and is not proximate to target tissue.

33. A non-transitory processor-readable memory programmed with instructions for execution by a processing circuit of an electronic weapon, the memory comprising:
    instructions for detecting a first voltage of a first stored energy, the first stored energy for attempting ionization of air in a gap between the electrode and the target;
    instructions for detecting a second voltage of a second stored energy, the second stored energy for providing after ionization a current via the electrode through the target to impede locomotion of the target;
    instructions for detecting an amount of charge provided by the first stored energy and the second stored energy through the target;
    instructions for selecting a state from a set of at least three states to describe an electrical coupling between an electrode of the electronic weapon and the target in accordance with the first voltage, the second voltage, and the amount of charge, each state of the set describes an electrical coupling between the electrode and the target; and
    instructions for providing a notice of the state wherein the set of states includes:
        a first state that corresponds to a value of the first voltage being greater than or equal to 200 volts and less than or equal to 400 volts and the amount of charge being between 55 microcoulombs and 71 microcoulombs; and
        a second state that corresponds to a value of the first voltage being greater than 400 volts and less than or equal to 800 volts, a value of the second voltage being less than 2401 volts, and the amount of charge being between 50 microcoulombs and 71 microcoulombs.

34. The memory of claim 33 wherein the three states of the set of states are mutually not co-existent.

35. The memory of claim 33 wherein the set of at least three states consists of contact, partial contact, and no contact.

36. The memory of claim 33 wherein the first state indicates that the electrode is in direct contact with target tissue.

37. The memory of claim 33 wherein the second state indicates that the electrode is proximate to target tissue so that the electrode electrically couples to target tissue via ionization of air in a gap between the electrode and target tissue.

38. The memory of claim 33 wherein a third state of the set indicates that the electrode is not in direct contact with target issue and is not proximate to target tissue.

* * * * *